(12) United States Patent
Wang

(10) Patent No.: US 12,269,112 B2
(45) Date of Patent: Apr. 8, 2025

(54) WELDING STRUCTURE CAPABLE OF ROTATIONAL MOVEMENT AND WELDING METHOD FOR THE SAME

(71) Applicant: DTECH PRECISION INDUSTRIES CO., LTD., New Taipei (TW)

(72) Inventor: Ting-Jui Wang, New Taipei (TW)

(73) Assignee: DTECH PRECISION INDUSTRIES CO., LTD., New Taipei (TW)

( * ) Notice: Subject to any disclaimer, the term of this patent is extended or adjusted under 35 U.S.C. 154(b) by 370 days.

(21) Appl. No.: 17/867,709

(22) Filed: Jul. 19, 2022

(65) Prior Publication Data

US 2023/0037056 A1 Feb. 2, 2023

(30) Foreign Application Priority Data

Aug. 2, 2021 (TW) ................................. 110128360

(51) Int. Cl.
*H05K 7/14* (2006.01)
*B23K 20/12* (2006.01)
*B23K 31/02* (2006.01)
*H05K 5/02* (2006.01)

(52) U.S. Cl.
CPC ............ *B23K 20/125* (2013.01); *B23K 31/02* (2013.01); *H05K 5/0221* (2013.01); *H05K 7/1409* (2013.01)

(58) Field of Classification Search
CPC ... B23K 20/125; H05K 5/0221; H05K 7/1409
USPC ........................................................ 361/720
See application file for complete search history.

(56) References Cited

U.S. PATENT DOCUMENTS

| | | | | |
|---|---|---|---|---|
| 5,793,614 A | * | 8/1998 | Tollbom | H05K 7/1409 |
| | | | | 361/801 |
| 6,395,976 B1 | * | 5/2002 | Koradia | H05K 7/1409 |
| | | | | 361/801 |
| 10,396,497 B1 | * | 8/2019 | Bame | H05K 7/1409 |
| 2003/0227754 A1 | * | 12/2003 | Osborn | H05K 7/1409 |
| | | | | 361/729 |
| 2006/0002094 A1 | * | 1/2006 | Cunha | H05K 7/1411 |
| | | | | 361/747 |
| 2017/0350477 A1 | * | 12/2017 | Wang | F16H 21/44 |
| 2020/0061800 A1 | * | 2/2020 | Wu | B25G 3/08 |
| 2020/0080578 A1 | * | 3/2020 | Wang | H05K 7/1417 |

FOREIGN PATENT DOCUMENTS

TW M575481 U 3/2019
TW M613049 U 6/2021

* cited by examiner

*Primary Examiner* — Zhengfu J Feng

(57) ABSTRACT

A welding structure capable of rotational movement and a welding method for the same are introduced. The welding structure capable of rotational movement includes a seat member and a rotational movement member. The seat member has a welding portion. The rotational movement member is movably fitted to the seat member. The rotational movement member has a pressing portion for welding the welding portion to an object; thus, the rotational movement member undergoes rotational movement while the pressing portion is pressing against a pressed object, thereby causing displacement of the object. Therefore, the welding structure capable of rotational movement and the welding method for the same exhibit enhancement of ease of use, labor saving, and convenience.

11 Claims, 12 Drawing Sheets

WELDING STRUCTURE CAPABLE OF ROTATIONAL MOVEMENT AND WELDING METHOD FOR THE SAME

CROSS-REFERENCE TO RELATED APPLICATION

This non-provisional application claims priority under 35 U.S.C. § 119(a) on Patent Application No(s). 110128360 filed in Taiwan, R.O.C. on Aug. 2, 2021, the entire contents of which are hereby incorporated by reference.

BACKGROUND OF THE INVENTION

1. Field of the Invention

The present disclosure relates to a welding structure capable of rotational movement and a welding method for the same, and in particular to a welding structure capable of rotational movement and a welding method for the same, characterized by enhancement of ease of use, labor saving, and convenience.

2. Description of the Related Art

Conventional electronic apparatuses commonly come with an unloading mechanism (also known as card-releasing mechanism). The purpose of the unloading mechanism is to enable separation of a hard disk drive or circuit board from a port disposed in the electronic apparatus. A user rotates the unloading mechanism to push the hard disk drive or circuit board, cause displacement thereof, and release the hard disk drive or circuit board from the port. However, the unloading mechanism is only able to cause a short displacement of the hard disk drive or circuit board; this, coupled with the presence of a partition plate of the apparatus or the proximity of neighboring devices, renders it difficult and inconvenient for the user to take the hard disk drive or circuit board.

BRIEF SUMMARY OF THE INVENTION

In view of the aforesaid drawbacks of the prior art, it is an objective of the disclosure to provide a welding structure capable of rotational movement and a welding method for the same, characterized by enhancement of ease of use, labor saving, and convenience.

In order to achieve the above and other objectives, the disclosure provides a welding structure capable of rotational movement, comprising a seat member and a rotational movement member. The seat member has a welding portion. The welding portion is adapted to be welded to an object. The rotational movement member is movably fitted to the seat member.

The disclosure further provides a welding structure capable of rotational movement, comprising a seat member and a rotational movement member. The seat member has a welding portion. The welding portion is adapted to be welded to an object. The rotational movement member is movably fitted to the seat member. The rotational movement member has a pressing portion. The rotational movement member undergoes rotational movement while the pressing portion is pressing against a pressed object, thereby causing displacement of the objects.

The disclosure further provides a welding method for a welding structure capable of rotational movement. The welding structure capable of rotational movement has a seat member and a rotational movement member. The seat member has a welding portion. The rotational movement member is movably fitted to the seat member. The method comprises the steps of: providing a tool for taking the welding structure capable of rotational movement; moving, with the tool, the welding structure capable of rotational movement to a mounting position of an object, wherein the tool releases or loosens the welding structure capable of rotational movement to move the seat member to the mounting position of the object and weld the seat member to the object through the welding portion.

The disclosure further provides a welding method for a welding structure capable of rotational movement. The welding structure capable of rotational movement has a seat member and a rotational movement member. The seat member has a welding portion. The rotational movement member is movably fitted to the seat member. The method comprises the steps of: providing a tool for taking the welding structure capable of rotational movement; moving, with the tool, the welding structure capable of rotational movement to a predetermined height of a mounting position of an object, wherein the tool releases or loosens the welding structure capable of rotational movement to move the seat member to the mounting position of the object and weld the seat member to the object through the welding portion.

The disclosure further provides a welding method for a welding structure capable of rotational movement. The welding structure capable of rotational movement has a seat member and a rotational movement member. The seat member has a welding portion. The rotational movement member is movably fitted to the seat member. The method comprises the steps of: providing a tool for taking the welding structure capable of rotational movement; moving, with the tool, the welding structure capable of rotational movement to a mounting position of an object, wherein the tool pushes the welding structure capable of rotational movement downward, such that the tool releases or loosens the welding structure capable of rotational movement to move the seat member to the mounting position of the object and weld the seat member to the object through the welding portion.

The disclosure further provides a welding method for a welding structure capable of rotational movement. The welding structure capable of rotational movement has a seat member and a rotational movement member. The seat member has a welding portion. The rotational movement member is movably fitted to the seat member. The method comprises the steps of: providing a tool for taking the welding structure capable of rotational movement; moving, with the tool, the welding structure capable of rotational movement to a mounting position of an object, wherein the tool resiliently pushes the welding structure capable of rotational movement downward, such that the tool releases or loosens the welding structure capable of rotational movement to move the seat member to the mounting position of the object and weld the seat member to the object through the welding portion.

The disclosure further provides a welding method for a welding structure capable of rotational movement. The welding structure capable of rotational movement has a seat member and a rotational movement member. The seat member has a welding portion. The rotational movement member is movably fitted to the seat member. The method comprises the steps of: providing a tool for taking the seat member; moving, with the tool, the seat member to a mounting position of an object, wherein the tool releases or loosens the seat member to move the seat member to the mounting position of the object, weld the seat member to the object through the welding portion, and mount the rotational movement member on the seat member.

The disclosure further provides a welding method for a welding structure capable of rotational movement. The welding structure capable of rotational movement has a seat member and a rotational movement member. The seat member has a welding portion. The rotational movement member is movably fitted to the seat member. The method comprises the steps of: providing a tool for taking the seat member; moving, with the tool, the seat member to a predetermined height of a mounting position of an object, wherein the tool releases or loosens the seat member to move the seat member to the mounting position of the object, weld the seat member to the object through the welding portion, and mount the rotational movement member on the seat member.

The disclosure further provides a welding method for a welding structure capable of rotational movement. The welding structure capable of rotational movement has a seat member and a rotational movement member. The seat member has a welding portion. The rotational movement member is movably fitted to the seat member. The method comprises the steps of: providing a tool for taking the seat member; moving, with the tool, the seat member to a mounting position of an object, wherein the tool pushes the seat member downward, such that the tool releases or loosens the seat member to move the seat member to the mounting position of the object, weld the seat member to the object through the welding portion, and mount the rotational movement member on the seat member.

The disclosure further provides a welding method for a welding structure capable of rotational movement. The welding structure capable of rotational movement has a seat member and a rotational movement member. The seat member has a welding portion. The rotational movement member is movably fitted to the seat member. The method comprises the steps of: providing a tool for taking the seat member; moving, with the tool, the seat member to a mounting position of an object, wherein the tool resiliently pushes the seat member downward, such that the tool releases or loosens the seat member to move the seat member to the mounting position of the object, weld the seat member to the object through the welding portion, and mount the rotational movement member on the seat member.

Regarding the welding structure capable of rotational movement and the welding method for the same, the seat member has a rotation-proof portion, and the object has a corresponding rotation-proof portion, wherein the rotation-proof portion and the corresponding rotation-proof portion prevent their rotation relative to each other.

Regarding the welding structure capable of rotational movement and the welding method for the same, a solder layer capable of becoming fixed in place after being heated and then cooled is disposed between the rotation-proof portion and the corresponding rotation-proof portion.

Regarding the welding structure capable of rotational movement and the welding method for the same, the seat member has a fixing portion adapted to be fastened to a corresponding fixing portion after the seat member has been welded to the object.

Regarding the welding structure capable of rotational movement and the welding method for the same, the welding structure capable of rotational movement further comprises a fastening portion disposed at the seat member and adapted to be fastened to an engaging portion.

Regarding the welding structure capable of rotational movement and the welding method for the same, a resilient component is disposed between the rotational movement member and the fastening portion. One end of the resilient component presses against the rotational movement member. The other end of the resilient component presses against the fastening portion.

Regarding the welding structure capable of rotational movement and the welding method for the same, the object has a connector connected to another connector of another object, and the pressing portion rotationally presses against a pressed object, such that the connector separates or loosens from the other connector under the pressing force.

Regarding the welding structure capable of rotational movement and the welding method for the same, the object is a printed circuit board (PCB) with a copper layer, and the copper layer is welded to the welding portion.

Regarding the welding structure capable of rotational movement and the welding method for the same, the object is a printed circuit board (PCB) with a copper layer, and the copper layer is welded to the welding portion by heating up a predetermined tin layer.

Regarding the welding structure capable of rotational movement and the welding method for the same, the seat member has two limiting structure members which the rotational movement member is disposed between.

Regarding the welding structure capable of rotational movement and the welding method for the same, the seat member has a movement portion adapted to be movably fitted to the rotational movement member, or the movement portion has a fitting portion movably fitted to the rotational movement member.

Regarding the welding structure capable of rotational movement and the welding method for the same, the welding portion of the seat member has a weldable layer, and the weldable layer is a tin layer, copper layer, nickel layer or zinc layer.

Regarding the welding structure capable of rotational movement and the welding method for the same, the pressing portion of the rotational movement member rotationally presses against the pressed object to cause displacement of the objects.

Regarding the welding structure capable of rotational movement and the welding method for the same, the welding structure capable of rotational movement further comprises a resilient component. One end of the resilient component presses against the seat member. The other end of the resilient component presses against the rotational movement member. The rotational movement member resiliently rotates back and forth.

Regarding the welding structure capable of rotational movement and the welding method for the same, the seat member has a movement portion adapted to be movably fitted to the seat member and having a resilient component. One end of the resilient component presses against the seat member. The other end of the resilient component presses against the movement portion. The movement portion or the seat member presses against the rotational movement member resiliently.

Regarding the welding structure capable of rotational movement and the welding method for the same, the seat member has a movement portion adapted to be movably fitted to the seat member and having a resilient component. One end of the resilient component has a connection portion connected to the seat member. The other end of the resilient component has another connection portion connected to the movement portion. The movement portion or the rotational movement member is resiliently driven to rotate resiliently.

Regarding the welding structure capable of rotational movement and the welding method for the same, the rotational movement member has a support portion, or the support portion is disposed at a fastening portion of the rotational movement member, with the support portion being adapted to prevent the seat member from toppling while being welded to the object.

Regarding the welding structure capable of rotational movement and the welding method for the same, after the seat member has been welded to the object, the rotational movement member is movably fitted to the seat member.

Regarding the welding structure capable of rotational movement and the welding method for the same, the welding method further comprises the steps of: providing, after the step of taking the welding structure capable of rotational movement or seat member with the tool, a comparison device for comparing the welding structure capable of rotational movement or seat member with a mounting position of the object or a mounting distance, and moving the welding structure capable of rotational movement to the mounting position of the object or the seat member to the mounting position with the tool according to comparison information of the comparison device.

Regarding the welding structure capable of rotational movement and the welding method for the same, the welding structure capable of rotational movement further comprises a carrier member, the welding structure capable of rotational movement or seat member is disposed in the carrier member, and the tool takes the welding structure capable of rotational movement or seat member from the carrier member.

Regarding the welding structure capable of rotational movement and the welding method for the same, the object has a prewelding layer, and the welding portion is welded to the object through the prewelding layer.

Regarding the welding structure capable of rotational movement and the welding method for the same, the welding portion of the seat member has a weldable layer, and the welding portion is welded to the object through the weldable layer.

Regarding the welding structure capable of rotational movement and the welding method for the same, the welding portion is heated up and welded to the object.

Regarding the welding structure capable of rotational movement and the welding method for the same, a solder layer is disposed between the welding portion and the object to, after being heated and then cooled, enable the welding portion to be welded to the object.

Regarding the welding structure capable of rotational movement and the welding method for the same, the object has a connector electrically connected to another connector of the other object. When the welding structure capable of rotational movement is rotated, the connector separates or loosens from the other connector under the force of rotationally pressing against a pressed object.

Regarding the welding structure capable of rotational movement and the welding method for the same, the object has a connector electrically connected to another connector of the other object. When the welding structure capable of rotational movement is rotated, the hot-pluggable connector separates or loosens from the other connector under the force of rotationally pressing against a pressed object.

Regarding the welding structure capable of rotational movement and the welding method for the same, the object, the other object or pressed object is a printed circuit board (PCB), motherboard, housing, case, heat sink, slide, cabinet, disk member, cage member, air-cooling structure member, water-cooling structure member, structure member immersed in water-cooling water, structure member for a server or structure member for a storage.

Regarding the welding structure capable of rotational movement and the welding method for the same, the tool is a vacuum extraction device, fastener, magnetic extraction device, clamp or robotic arm.

Regarding the welding structure capable of rotational movement and the welding method for the same, the comparison device is a vision comparison device, image comparison device, AI comparison device, 3D comparison device, 2D comparison device or distance comparison device.

Therefore, according to the disclosure, the welding structure capable of rotational movement and the welding method for the same exhibit enhanced ease of use, enhanced labor saving, and enhanced convenience.

DETAILED DESCRIPTION OF THE INVENTION

Objectives, features, and advantages of the disclosure are hereunder illustrated with specific embodiments, depicted with drawings, and described below.

Figure 1:
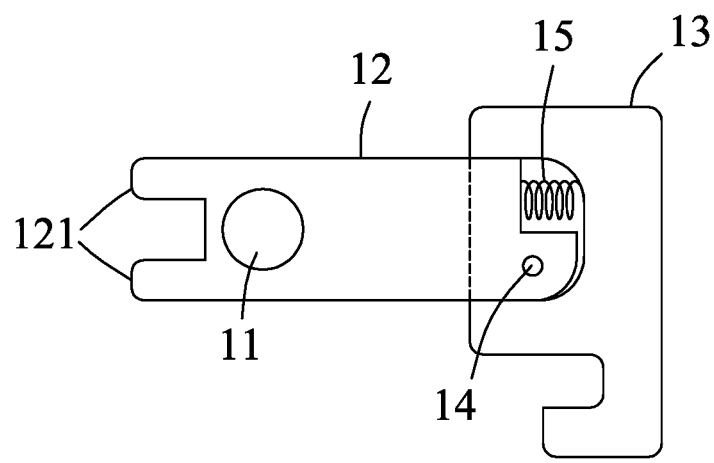
FIG. 1 is a perspective view of a welding structure capable of rotational movement according to the first embodiment of the disclosure.
Figure 2:
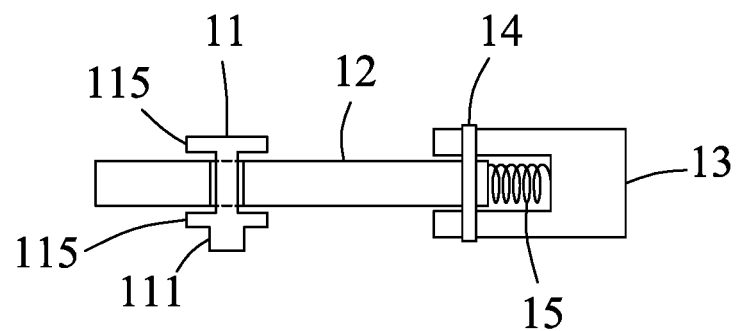
FIG. 2 is a side view of the welding structure capable of rotational movement according to the first embodiment of the disclosure.
Figure 3:
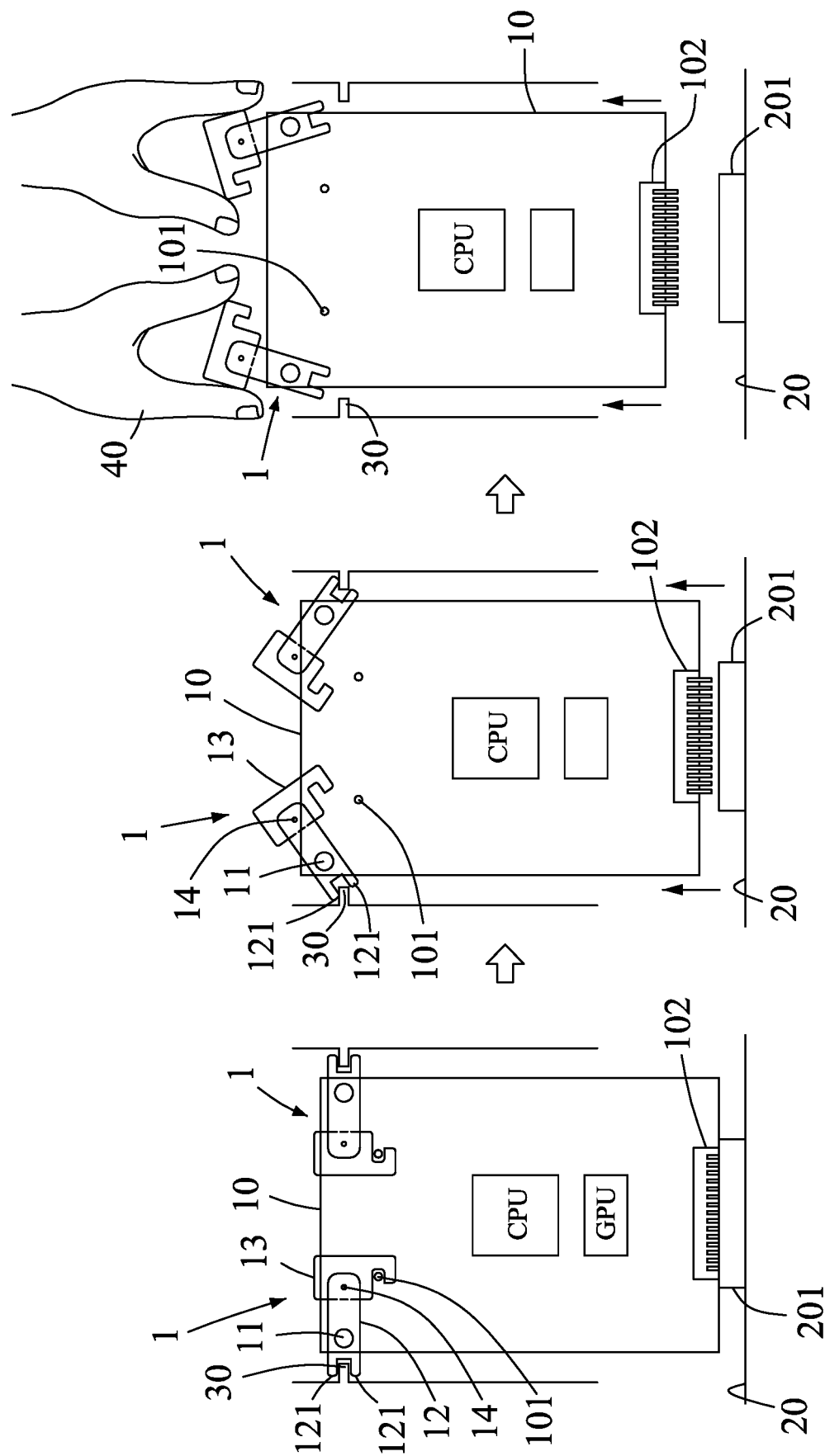
FIG. 3 is a schematic view of the welding structure capable of rotational movement in operation according to the first embodiment of the disclosure.

Referring to FIG. 1 through FIG. 3, the disclosure provides a welding structure 1 capable of rotational movement and a welding method for the same. The welding structure 1 capable of rotational movement comprises a seat member 11 and a rotational movement member 12.

The seat member 11 has a welding portion 111. The welding portion 111 is adapted to be welded to an object 10. The object 10 is a printed circuit board (PCB).

The rotational movement member 12 is movably fitted to the seat member 11. The rotational movement member 12 has a pressing portion 121.

To start operating the welding structure 1 capable of rotational movement, the rotational movement member 12 undergoes rotational movement while the pressing portion 121 is pressing against another object 20, thereby causing displacement of the object 10.

In an embodiment of the disclosure, after the seat member 11 has been welded to the object 10, the rotational movement member 12 is movably fitted to the seat member 11.

In an embodiment of the disclosure, the welding structure 1 capable of rotational movement further comprises a fastening portion 13. The fastening portion 13 is movably disposed at the seat member 11 through a bolting portion 14. The fastening portion 13 is adapted to be fastened to an engaging portion 101 of the object 10.

In an embodiment of the disclosure, a resilient component 15 is disposed between the rotational movement member 12 and the fastening portion 13. One end of the resilient component 15 presses against the rotational movement member 12. The other end of the resilient component 15 presses against the fastening portion 13. Thus, the bolting portion 14 and the resilient component 15 together enable the fastening portion 13 to move relative to the rotational movement member 12 and then automatically reset.

In an embodiment of the disclosure, the object 10 has a connector 102. The connector 102 connects to another connector 201 of the other object 20. The pressing portion 121 rotationally presses against a pressed object 30, such that the connector 102 separates or loosens from the other connector 201 under the pressing force.

In an embodiment of the disclosure, the object 10 has a connector 102. The connector 102 is electrically connected to the other connector 201 of the other object 20. When the welding structure 1 capable of rotational movement is rotated, the connector 102 separates or loosens from the other connector 201 under the force of rotationally pressing against a pressed object 30, thereby allowing the disclosure to meet application needs.

In an embodiment of the disclosure, the object 10 has a connector 102 adapted to be electrically connected to another connector 201 of the other object 20. When the welding structure 1 capable of rotational movement is rotated, the hot-pluggable connector 102 separates or loosens from the other connector 201 under the force of rotationally pressing against a pressed object 30, thereby allowing the disclosure to meet application needs.

In an embodiment of the disclosure, the object 10, the other object 20 or the pressed object 30 is a printed circuit board (PCB), motherboard, housing, case, heat sink, slide, cabinet, disk member, cage member, air-cooling structure member, water-cooling structure member, structure member immersed in water-cooling water, structure member for a server or structure member for a storage, thereby allowing the disclosure to meet application needs.

In an embodiment of the disclosure, the pressing portion 121 of the rotational movement member 12 rotationally presses against the pressed object 30 to cause displacement of the object 10.

In an embodiment of the disclosure, the seat member 11 has two limiting structure members 115, and the rotational movement member 12 is disposed between the limiting structure members 115, thereby allowing the seat member 11 and the rotational movement member 12 to be firmly coupled together.

As shown in FIG. 3, in practice, two welding structures 1 capable of rotational movement flank the object 10. When the connector 102 of the object 10 is connected to another connector 201 of the other object 20, the fastening portions 13 is fastened to the engaging portions 101 of the object 10. At this point in time, the resilient components 15 are in a compressed state; thus, not only are the fastening portions 13 firmly fastened to the engaging portions 101, but the pressing portion 121 is also insertedly engaged with the pressed objects 30. To separate the object 10 from the fastening portion 13, a finger 40 applies a force on the fastening portions 13 to allow the fastening portions 13 to move in the presence of the bolting portions 14. Thus, not only are the fastening portions 13 unfastened from the engaging portions 101, but the resilient components 15 are also stretched and then resiliently return to a compressed state. After the fastening portions 13 have been unfastened from the engaging portions 101, the finger 40 applies a force on the rotational movement members 12 or the fastening portions 13; thus, not only do the rotational movement members 12 rotate about the seat members 11, respectively, but the pressing portions 121 also press against the pressed objects 30 to generate a pressing force as soon as the rotational movement members 12 rotate to a predetermined position. Therefore, the connector 102 separates or loosens from the other connector 201 under a pressing force to thereby enable the removal of the object 10, with enhanced ease of use, enhanced labor saving, and enhanced convenience.

Figure 4:
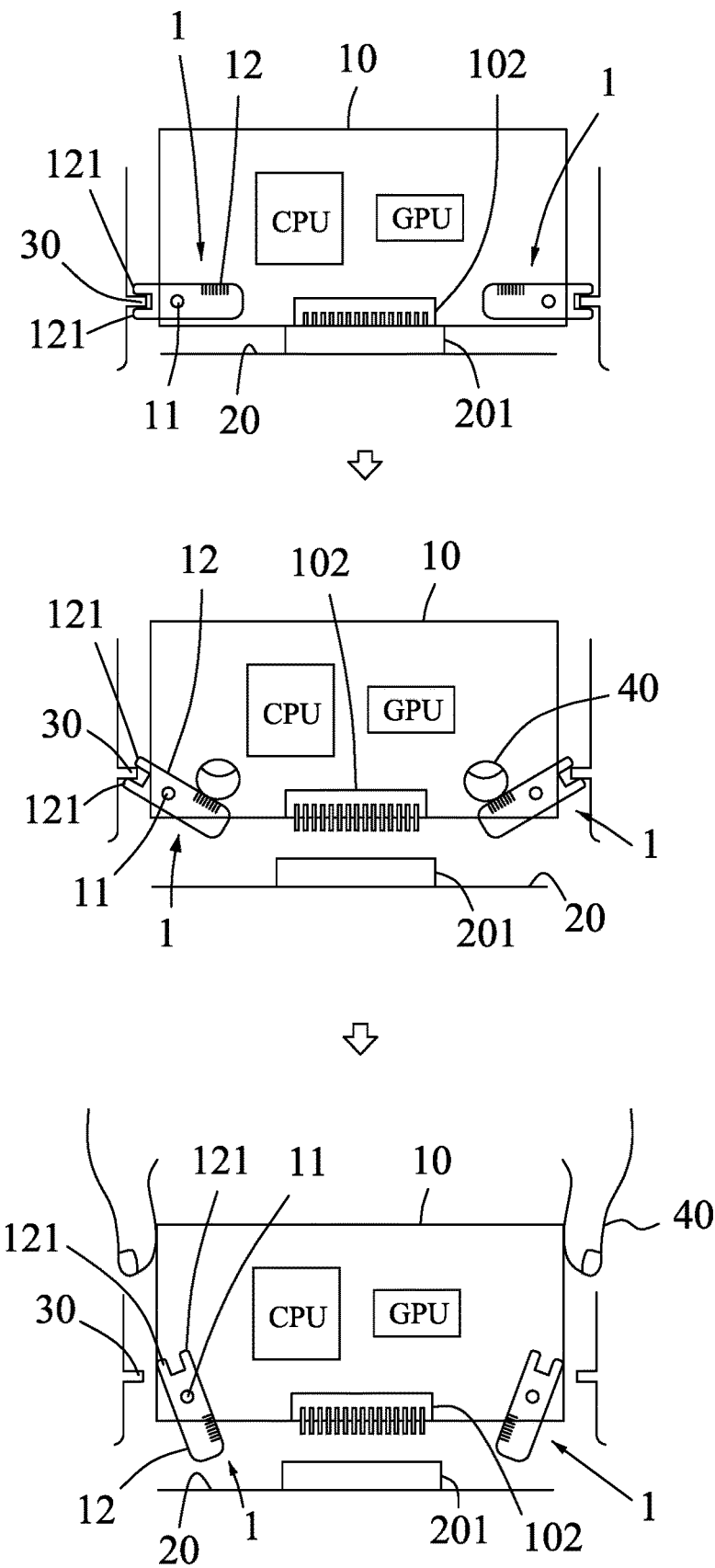
FIG. 4 is a schematic view of the welding structure capable of rotational movement in operation according to the second embodiment of the disclosure.

Referring to FIG. 4, unlike its counterpart in the preceding embodiments, the rotational movement member 12 in this embodiment dispenses with the fastening portion 13, the bolting portion 14 and the resilient component 15. However, the rotational movement member 12 in this embodiment also has two welding structures 1 capable of rotational movement which flank the object 10. When the connector 102 of the object 10 is connected to the other connector 201 of the other object 20, the rotational movement members 12 lie in a horizontal state, and the pressing portion 121 is insertedly engaged with the pressed objects 30. To attain the removal of the object 10, the finger 40 applies a force on the rotational movement members 12 to not only allow the rotational movement members 12 to rotate about the seat members 11, respectively, but also allow the pressing portions 121 to press against the pressed objects 30 and generate a pressing force as soon as the rotational movement members 12 rotate to a predetermined position. Therefore, the connector 102 separates or loosens from the other connector 201 under a pressing force to thereby attain the removal of the object 10, with enhanced ease of use, enhanced labor saving, and enhanced convenience.

Figure 5:
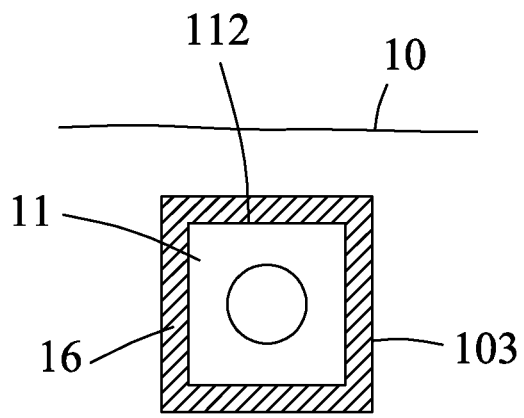
FIG. 5 is a schematic view of the welding structure capable of rotational movement in operation according to the third embodiment of the disclosure.

Referring to FIG. 5, unlike their counterparts in the preceding embodiments, the seat member 11 in this embodiment has a rotation-proof portion 112, and the object 10 in this embodiment has a corresponding rotation-proof portion 103. The rotation-proof portion 112 and the corresponding rotation-proof portion 103 prevent their rotation relative to each other. A solder layer 16 capable of becoming fixed in place after being heated and then cooled is disposed between the rotation-proof portion 112 and the corresponding rotation-proof portion 103. Thus, the seat member 11 can be firmly coupled to the object 10 to avoid loosening while the rotational movement member 12 is being operated, thereby maintaining stability of operation.

Figure 6:
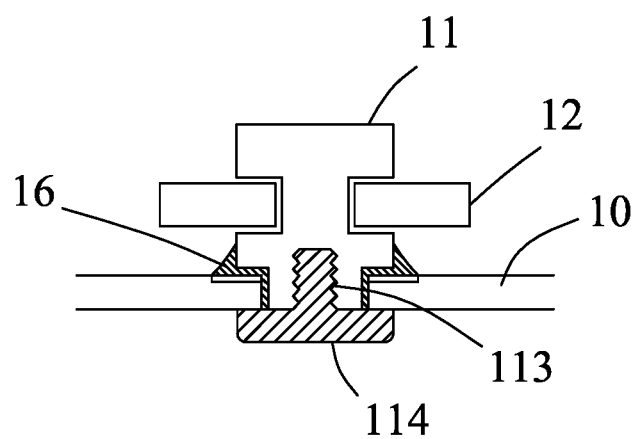
FIG. 6 is a schematic view of the welding structure capable of rotational movement in operation according to the fourth embodiment of the disclosure.

Referring to FIG. 6, this embodiment is different from the preceding embodiments. In this embodiment, the seat member 11 has a fixing portion 113. After the seat member 11 has been welded to the object 10 through the solder layer 16, the fixing portion 113 is fastened to a corresponding fixing portion 114. Thus, the seat member 11 is firmly coupled to the object 10 to avoid loosening while the rotational movement member 12 is being operated, thereby maintaining stability of operation.

Figure 7:
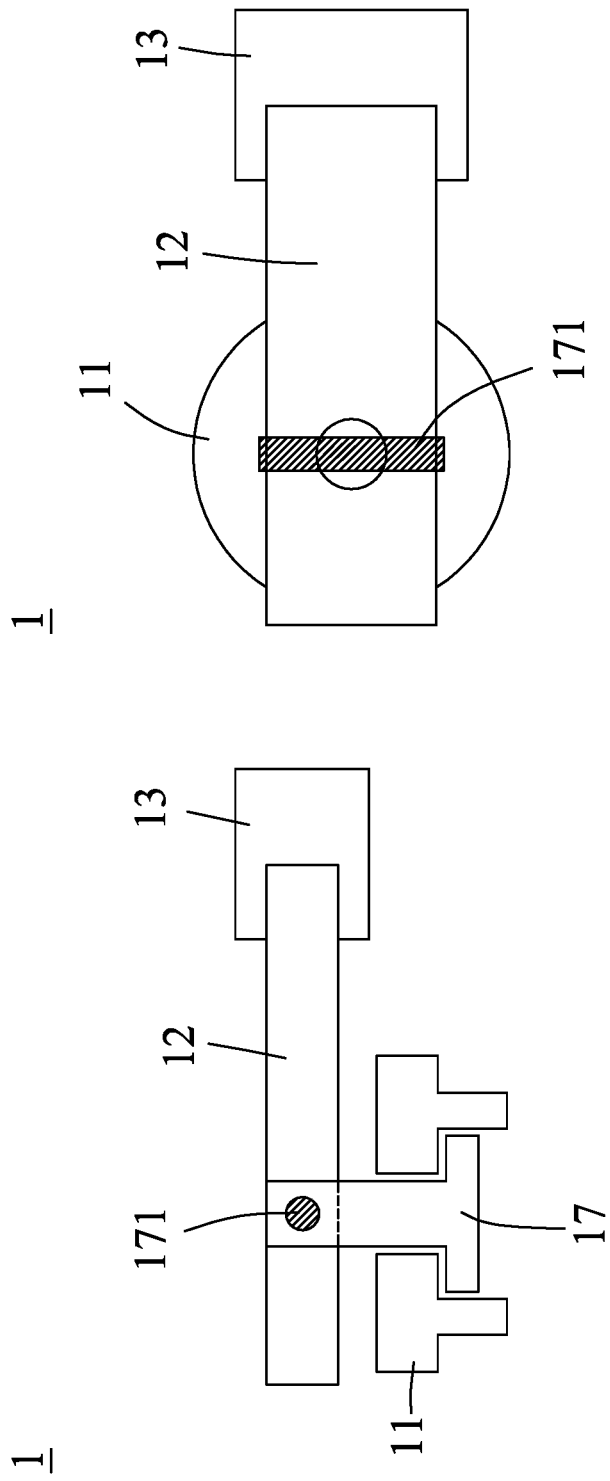
FIG. 7 is a schematic view of the welding structure capable of rotational movement according to the fifth embodiment of the disclosure.

Referring to FIG. 7, this embodiment is different from the preceding embodiments. In this embodiment, the seat member 11 has a movement portion 17. The movement portion 17 is adapted to be movably fitted to the rotational movement member 12. The rotational movement member 12 is disposed between two structure members. The movement portion 17 has a fitting portion 171 movably fitted to the rotational movement member 12. Operation of the rotational movement member 12 requires joint operation of the movement portion 17 and the fitting portion 171 to enable rotation on the seat member 11 and achieve various operations disclosed in the embodiments above, with enhanced ease of use, enhanced labor saving, and enhanced convenience.

Figure 8:
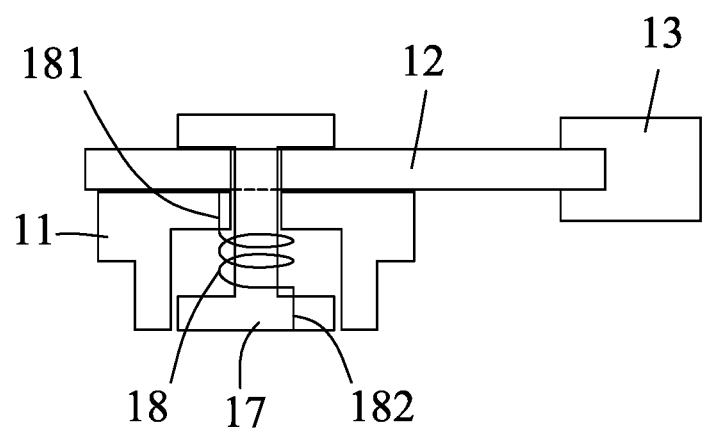
FIG. 8 is a schematic view of the welding structure capable of rotational movement according to the sixth embodiment of the disclosure.

Referring to FIG. 8, this embodiment is different from the preceding embodiments. In this embodiment, a resilient component 18 is disposed between the seat member 11 and the movement portion 17, has one end pressing against the seat member 11, and has the other end pressing against the movement portion 17, thereby allowing the movement portion 17 or the seat member 11 to resiliently press against the rotational movement member 12. In this embodiment, one end of the resilient component 18 has a connection portion 181 connected to the seat member 11, and the other end of the resilient component 18 has another connection portion 182 connected to the movement portion 17, thereby allowing the movement portion 17 or the rotational movement member 12 to be resiliently driven to rotate resiliently, with enhanced ease of use, enhanced labor saving, and enhanced convenience.

Figure 9:
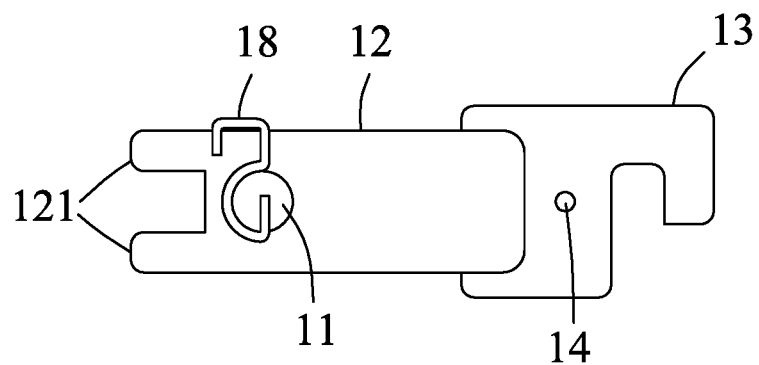
FIG. 9 is a schematic view of the welding structure capable of rotational movement in operation according to the seventh embodiment of the disclosure.
Figure 9:
Figure 9:
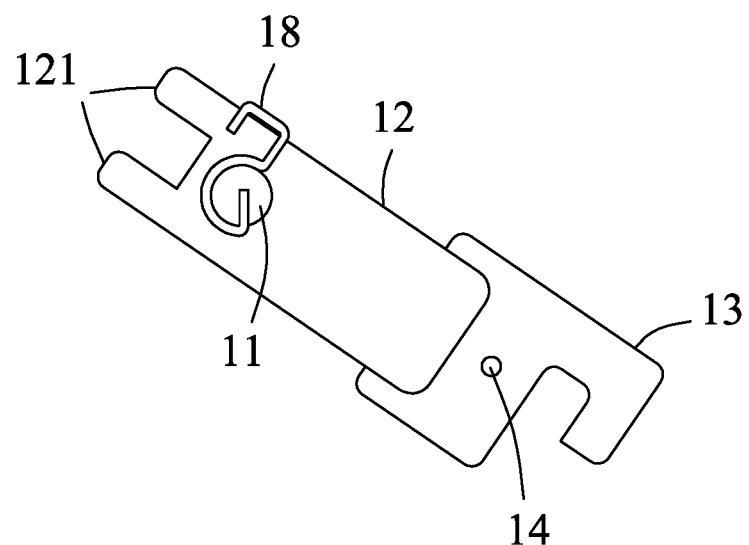

Referring to FIG. 9, this embodiment is different from the preceding embodiments. In this embodiment, the welding structure 1 capable of rotational movement further comprises a resilient component 18. One end of the resilient component 18 presses against the seat member 11. The other end of the resilient component 18 presses against the rotational movement member 12. Thus, the rotational movement member 12 resiliently rotates back and forth, with enhanced ease of use, enhanced labor saving, and enhanced convenience.

Figure 10:
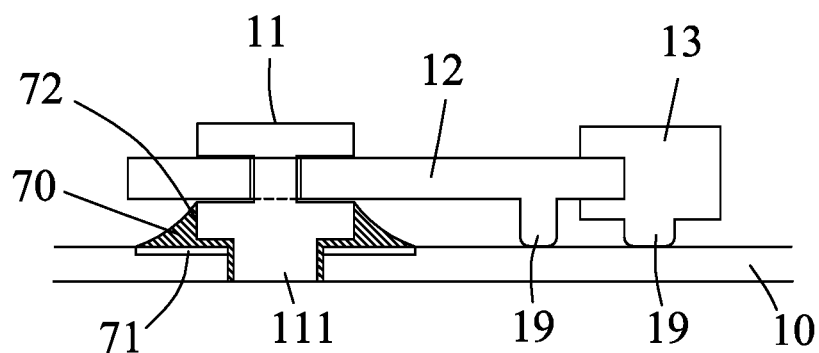
FIG. 10 is a schematic view of the welding structure capable of rotational movement in operation according to the eighth embodiment of the disclosure.
Figure 11:
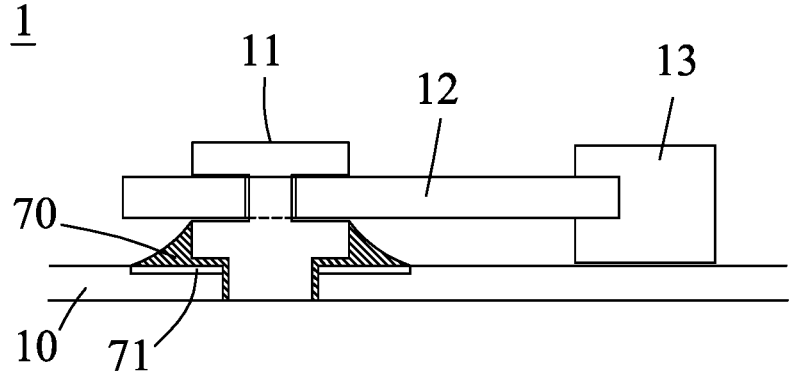
FIG. 11 is a schematic view of the welding structure capable of rotational movement in operation according to the ninth embodiment of the disclosure.

Referring to FIG. 10 and FIG. 11, this embodiment is different from the preceding embodiments. In this embodiment, the rotational movement member 12 has a support portion 19. The support portion 19 prevents the seat member 11 from toppling while being welded to the object 10 (as shown in FIG. 11). The support portion 19 is disposed at the rotational movement member 12 (as shown in FIG. 10). Alternatively, the support portion 19 is disposed at the fastening portion 13 of the seat member 11 or at the fastening portion of the seat member 11.

The object 10 is a printed circuit board (PCB) which has a copper layer 71 or a prewelding layer. The copper layer 71 is adapted to be welded to the welding portion 111. A predetermined tin layer of the welding portion 111 is heated up, thereby allowing the copper layer 71 to be welded to the welding portion 111. The welding portion 111 of the seat member 11 has a weldable layer 72. The weldable layer 72 is a tin layer, copper layer, nickel layer or zinc layer; thus, the weldable layer 72 enables the welding portion 111 to be welded to the copper layer 71 of the object 10. Therefore, the copper layer 71 and the weldable layer 72 together form a solder layer 70 between the welding portion 111 and the object 10. After being heated and then cooled, the solder layer 70 enables the welding portion 111 to be welded to the object 10.

Figure 12:
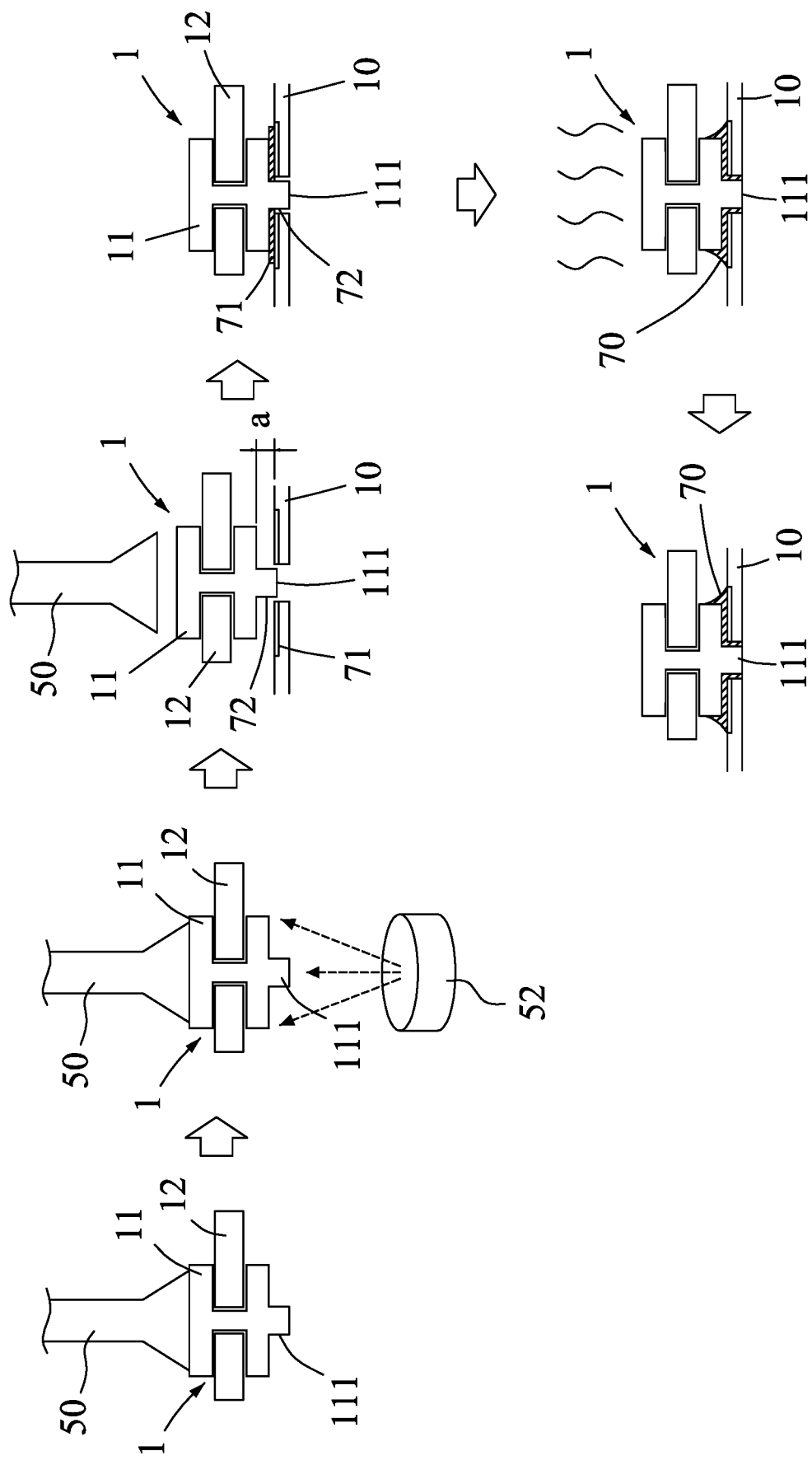
FIG. 12 is the first schematic view of a welding method for the welding structure capable of rotational movement according to the disclosure.

Referring to FIG. 12, the disclosure provides a welding method for a welding structure capable of rotational movement. The welding structure 1 capable of rotational movement has a seat member 11 and a rotational movement member 12. The seat member 11 has a welding portion 111. The rotational movement member 12 is movably fitted to the seat member 11. The method comprises the steps of:

Provide a tool 50 for taking the welding structure 1 capable of rotational movement.

Move, with the tool 50, the welding structure 1 capable of rotational movement to a predetermined height an of a mounting position of an object 10.

The tool 50 releases or loosens the welding structure 1 capable of rotational movement to move the seat member 11 to the mounting position of the object 10; thus, the welding portion 111 is heated up, allowing the seat member 11 to be welded to the object 10.

In an embodiment of the disclosure, the welding method further comprises, after the step of taking the welding structure 1 capable of rotational movement with the tool 50, providing a comparison device 51 for comparing the welding structure 1 capable of rotational movement with a mounting position of the object 10 or a mounting distance, and moving the welding structure 1 capable of rotational movement to the mounting position of the object 10 with the tool 50 according to comparison information of the comparison device 51.

In an embodiment of the disclosure, the comparison device 51 is a vision comparison device, image comparison device, AI comparison device, 3D comparison device, 2D comparison device or distance comparison device. Thus, the disclosure meets different assembly needs.

In an embodiment of the disclosure, the object 10 is a printed circuit board (PCB) which has a copper layer 71 or a prewelding layer. The copper layer 71 is adapted to be welded to the welding portion 111. A predetermined tin layer of the welding portion 111 is heated up, thereby allowing the copper layer 71 to be welded to the welding portion 111. The welding portion 111 of the seat member 11 has a weldable layer 72. The weldable layer 72 is a tin layer, copper layer, nickel layer or zinc layer; thus, the weldable layer 72 enables the welding portion 111 to be welded to the copper layer 71 of the object 10. Therefore, the copper layer 71 and the weldable layer 72 together form a solder layer 70 between the welding portion 111 and the object 10. After being heated and then cooled, the solder layer 70 enables the welding portion 111 to be welded to the object 10.

In an embodiment of the disclosure, the tool 50 is a vacuum extraction device, fastener, magnetic extraction device, clamp or robotic arm. Thus, the disclosure meets different assembly needs.

Referring to FIG. 1, FIG. 2 and FIG. 12, in an embodiment of the disclosure, to begin the assembly process, the tool 50 takes the seat member 11, and the tool 50 moves the seat member 11 to a predetermined height an of the mounting position of the object 10, such that the tool 50 releases or loosens the seat member 11; thus, the seat member 11 is moved to the mounting position of the object 10, and then the seat member 11 is welded to the object 10 through the welding portion 111. After that, the rotational movement member 12 is mounted on the seat member 11. The assembly technique disclosed in this embodiment is also applicable to the welding structure 1 capable of rotational movement in the preceding embodiments.

Figure 13:
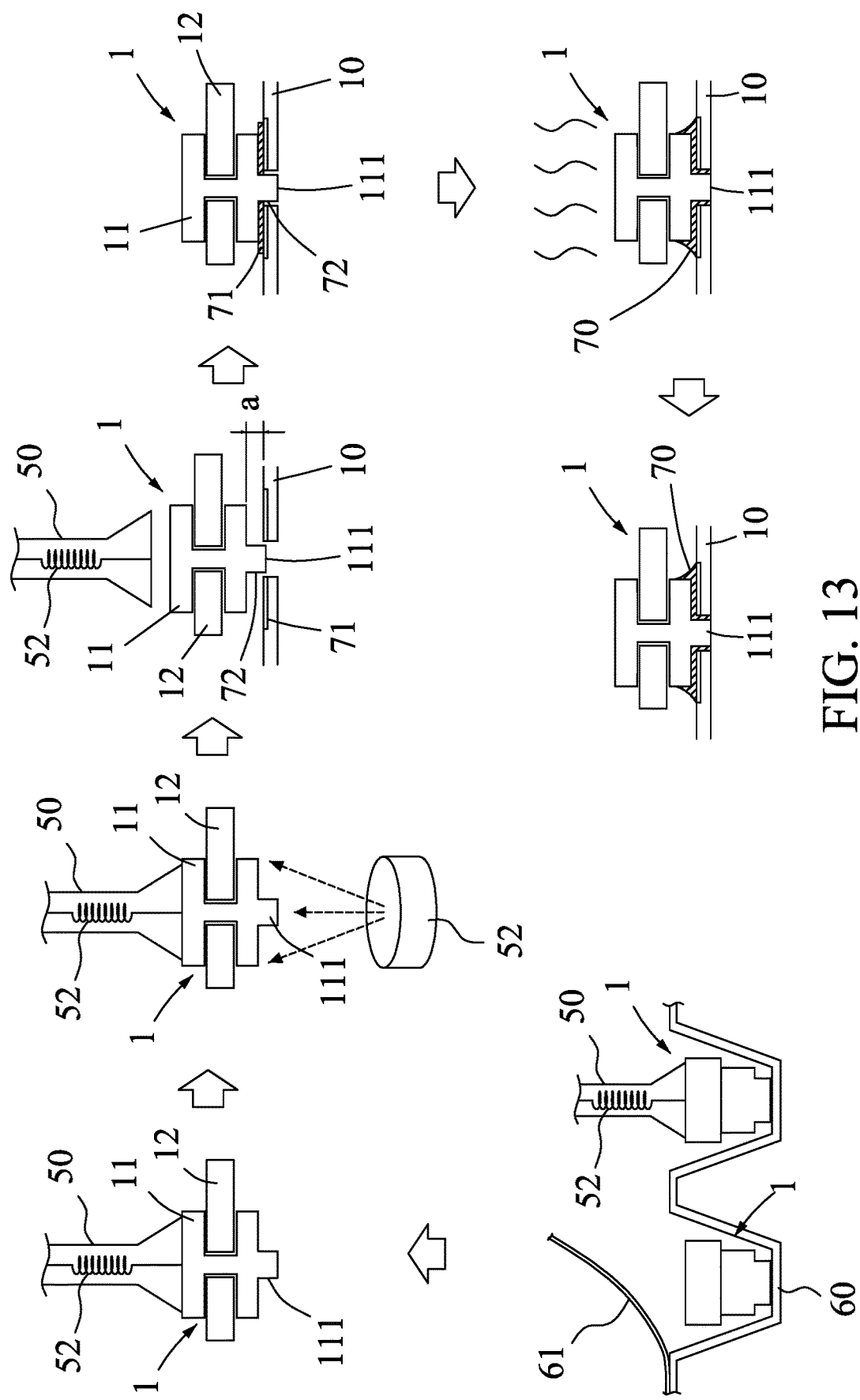
FIG. 13 is the second schematic view of the welding method for the welding structure capable of rotational movement according to the disclosure.

Referring to FIG. 13, the disclosure provides a welding method for a welding structure 1 capable of rotational movement. The welding structure 1 capable of rotational movement has a seat member 11 and a rotational movement member 12. The seat member 11 has a welding portion 111. The rotational movement member 12 is movably fitted to the seat member 11. The method comprises the steps as follows:

Provide a tool 50 for taking the welding structure 1 capable of rotational movement.

Move, with the tool 50, the welding structure 1 capable of rotational movement to a mounting position of an object 10.

The tool 50 pushes the welding structure 1 capable of rotational movement downward. Then, the tool 50 releases or loosens the welding structure 1 capable of rotational movement to move the seat member 11 to the mounting position of the object 10 and weld the seat member 11 to the object 10 through the welding portion 11.

In an embodiment of the disclosure, the weldable layer 72 enables the welding portion 111 to be welded to a copper layer 71 of the object 10. Therefore, the copper layer 71 and the weldable layer 72 together form a solder layer 70 between the welding portion 111 and the object 10. After being heated and then cooled, the solder layer 70 enables the welding portion 111 to be welded to the object 10.

In an embodiment of the disclosure, the welding structure 1 capable of rotational movement is disposed in a carrier member 60, and the tool 50 takes the welding structure 1 capable of rotational movement from the carrier member 60. The carrier member 60 has a cover member 61. The cover member 61 seals the welding structure 1 capable of rotational movement in the carrier member 60.

In an embodiment of the disclosure, the tool 50 has a resilience sensor 52. When the tool 50 moves the welding structure 1 capable of rotational movement to a mounting position of the object 10, the resilience sensor 52 of the tool 50 senses a feedback information about the welding structure 1 capable of rotational movement coming into contact with the object 10 to thereby cause the tool 50 to release or loosen the welding structure 1 capable of rotational movement, such that the welding structure 1 capable of rotational movement is placed at the mounting position of the object 10. Thus, the disclosure meets different assembly needs.

Referring to FIG. 1, FIG. 2 and FIG. 13, in an embodiment of the disclosure, to begin the assembly process, the tool 50 takes the seat member 11, and the tool 50 moves the seat member 11 to the mounting position of the object 10. After that, the tool 50 pushes the seat member 11 downward, and then the tool 50 releases or loosens the seat member 11; thus, the seat member 11 is moved to the mounting position of the object 10, and then the seat member 11 is welded to the object 10 through the welding portion 111. Next, the rotational movement member 12 is mounted on the seat member 11. The assembly technique disclosed in this embodiment is also applicable to the welding structure 1 capable of rotational movement in the preceding embodiments.

Figure 14:
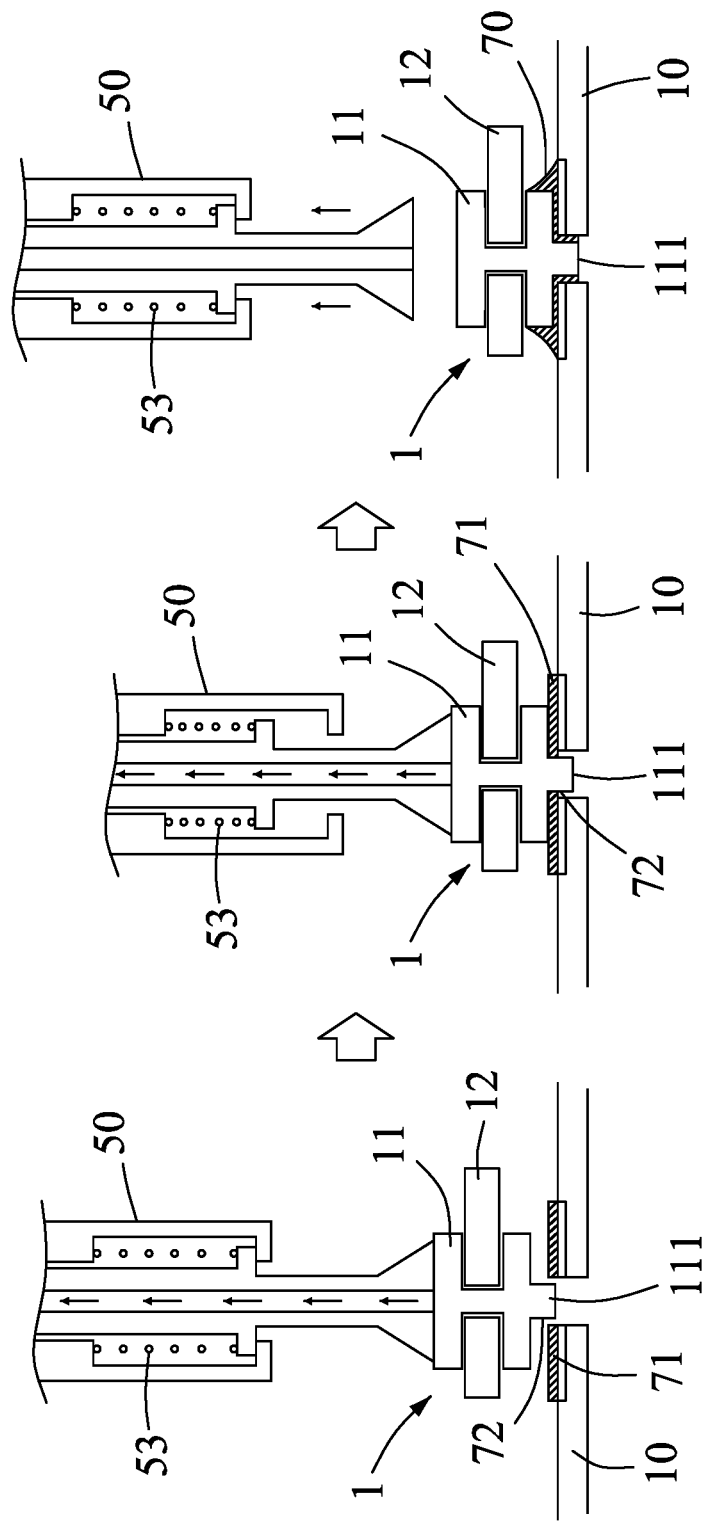
FIG. 14 is the third schematic view of the welding method for the welding structure capable of rotational movement according to the disclosure.

Referring to FIG. 14, the disclosure provides a welding method for a welding structure capable of rotational movement, wherein the welding structure 1 capable of rotational movement has a seat member 11 and a rotational movement member 12. The seat member 11 has a welding portion 111. The rotational movement member 12 is movably fitted to the seat member 11. The method comprises the steps as follows:

Provide a tool 50 for taking the welding structure 1 capable of rotational movement.

Move, with the tool 50, the welding structure 1 capable of rotational movement to a mounting position of an object 10.

The tool 50 resiliently pushes the welding structure 1 capable of rotational movement downward, and then the tool 50 releases or loosens the welding structure 1 capable of rotational movement to move the seat member 11 to a mounting position of the object 10 and weld the seat member 11 to the object 10 through the welding portion 11.

In an embodiment of the disclosure, the tool 50 has a resilient structure 53. After the tool 50 has taken the welding structure 1 capable of rotational movement by extraction, the tool 50 moves the welding structure 1 capable of rotational movement to the mounting position of an object 10; thus, the resilient structure 53 of the tool 50 resiliently pushes the welding structure 1 capable of rotational movement downward. Then, the tool 50 releases or loosens the welding structure 1 capable of rotational movement to thereby move the seat member 11 to the mounting position of the object 10 and weld the seat member 11 to the object 10 through the welding portion 11.

In an embodiment of the disclosure, the weldable layer 72 enables the welding portion 111 to be welded to the copper layer 71 of the object 10. Therefore, the copper layer 71 and the weldable layer 72 together form a solder layer 70 between the welding portion 111 and the object 10. After being heated and then cooled, the solder layer 70 enables the welding portion 111 to be welded to the object 10.

Referring to FIG. 1, FIG. 2 and FIG. 14, in an embodiment of the disclosure, to begin the assembly process, the tool 50 takes the seat member 11, and then the tool 50 moves the seat member 11 to the mounting position of the object 10, such that the tool 50 resiliently pushes the seat member 11 downward. Then, the tool 50 releases or loosens the seat member 11 to move the seat member 11 to the mounting position of the object 10 and weld the seat member 11 to the object 10 through the welding portion 111. Next, the rotational movement member 12 is mounted on the seat member 11. The assembly technique disclosed in this embodiment is also applicable to the welding structure 1 capable of rotational movement in the preceding embodiments.

Figure 15:
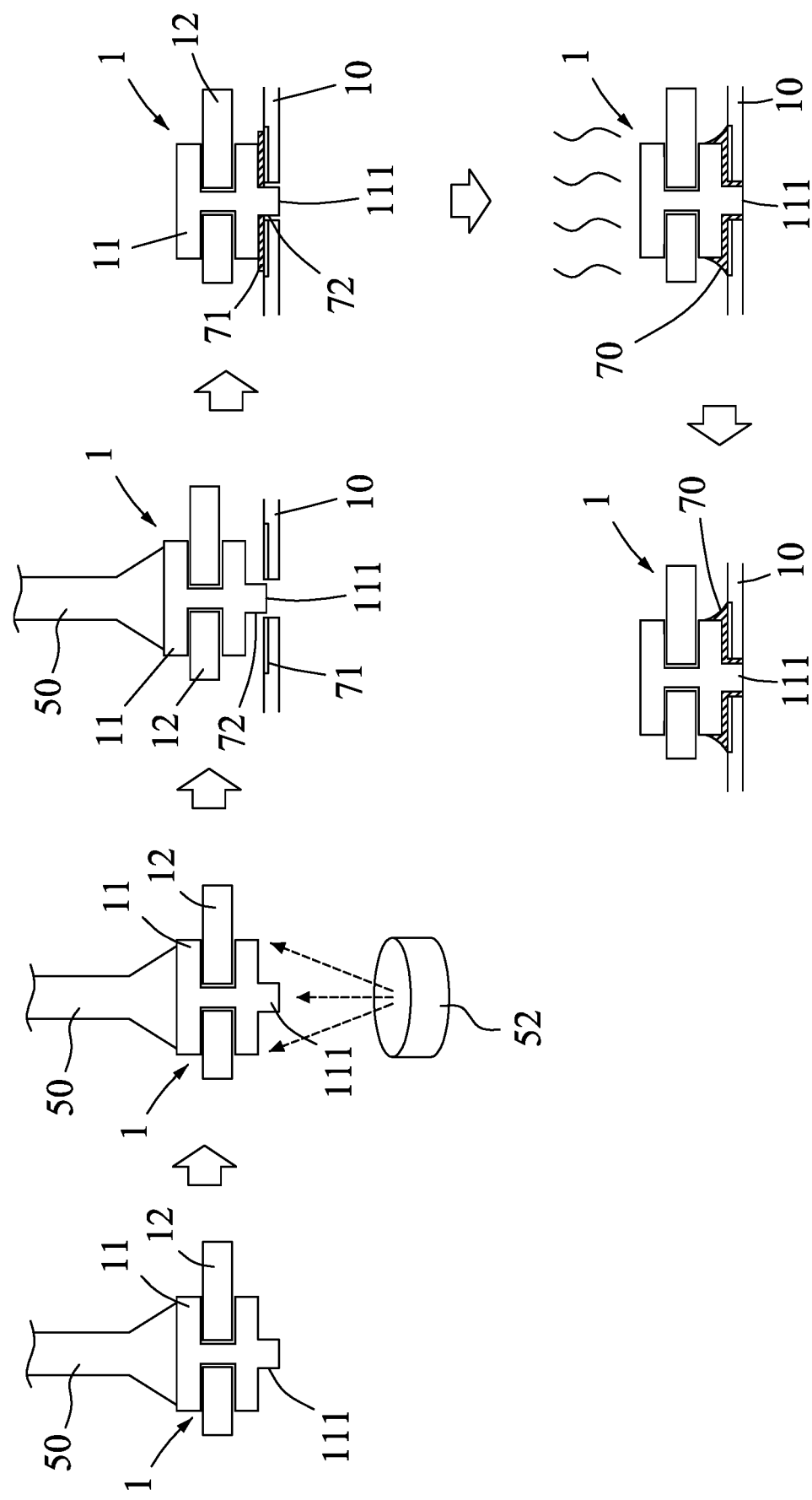
FIG. 15 is the fourth schematic view of the welding method for the welding structure capable of rotational movement according to the disclosure.

Referring to FIG. 15, the disclosure provides a welding method for a welding structure 1 capable of rotational movement. The welding structure 1 capable of rotational movement has a seat member 11 and a rotational movement member 12. The seat member 11 has a welding portion 111. The rotational movement member 12 is movably fitted to the seat member 11. The method comprises the steps of:

Provide a tool 50 for taking the welding structure 1 capable of rotational movement.

Move, with the tool 50, the welding structure 1 capable of rotational movement to a mounting position of an object 10.

The tool 50 releases or loosens the welding structure 1 capable of rotational movement to move the seat member 11 to the mounting position of the object 10 and weld the seat member 11 to the object 10 through the welding portion 111.

Referring to FIG. 1, FIG. 2 and FIG. 15, in an embodiment of the disclosure, to begin the assembly process, the tool 50 takes the seat member 11 and then moves the seat member 11 to the mounting position of the object 10. Then, the tool 50 releases or loosens the seat member 11 and moves the seat member 11 to the mounting position of the object 10, so as to weld the seat member 11 to the object 10 through the welding portion 111. After that, the rotational movement member 12 is mounted on the seat member 11. The assembly technique disclosed in this embodiment is also applicable to the welding structure 1 capable of rotational movement in the preceding embodiments.

The disclosure is disclosed above by preferred embodiments. However, persons skilled in the art should understand that the embodiments are illustrative of the disclosure only, but shall not be interpreted as restrictive of the scope of the disclosure. Hence, all equivalent modifications and replacements made to the aforesaid embodiments shall be deemed falling within the scope of the disclosure. Accordingly, the legal protection for the disclosure shall be defined by the appended claims.

What is claimed is:

1. A welding structure capable of rotational movement, comprising:
   a seat member having a welding portion, the welding portion being adapted to be welded to an object; and
   a rotational movement member movably fitted to the seat member,
   wherein the object has a copper layer or a prewelding layer, the welding portion has a weldable layer, the weldable layer has a surface, the surface is in a periphery of the welding portion, and the surface of the weldable layer is welded to the copper layer or the prewelding layer of the object by a solder layer.

2. The welding structure capable of rotational movement of claim 1, wherein the rotational movement member has a pressing portion, and the rotational movement member undergoes rotational movement while the pressing portion is pressing against the pressed object, thereby causing displacement of the object.

3. The welding structure capable of rotational movement of claim 1, wherein the seat member has a fixing portion fastened to a corresponding fixing portion after the seat member has been welded to the object.

4. The welding structure capable of rotational movement of claim 1, further comprising a fastening portion, wherein the fastening portion is movably disposed at the seat member through a bolting portion, and adapted to be fastened to an engaging portion, with a resilient component being disposed between the rotational movement member and the fastening portion, having an end pressing against the rotational movement member, and having another end pressing against the fastening portion.

5. The welding structure capable of rotational movement of claim 2, wherein the object has a connector connected to another connector of another object, and the pressing portion rotationally presses against a pressed object, such that the connector separates or loosens from the other connector under the pressing force.

6. The welding structure capable of rotational movement of claim 1, wherein the seat member has two limiting structure members, and the rotational movement member is disposed between the limiting structure members.

7. The welding structure capable of rotational movement of claim 1, wherein the seat member has a movement portion adapted to be movably fitted to the rotational movement member, or the movement portion having a fitting portion movably fitted to the rotational movement member.

8. The welding structure capable of rotational movement of claim 2, wherein the pressing portion of the rotational movement member rotationally presses against pressed object to cause displacement of the object.

9. The welding structure capable of rotational movement of claim 1, further comprising a resilient component with an end pressing against the seat member and another end pressing against the rotational movement member to allow the rotational movement member to resiliently rotate back and forth.

10. The welding structure capable of rotational movement of claim 1, wherein the seat member has a movement portion adapted to be movably fitted to the seat member and having a resilient component, the resilient component having an end pressing against the seat member and having another end pressing against the movement portion, thereby allowing the movement portion or the seat member to press against the rotational movement member resiliently.

11. The welding structure capable of rotational movement of claim 1, wherein the rotational movement member has a support portion, or the support portion is disposed at a fastening portion of the rotational movement member, and the support portion prevents the seat member from toppling while being welded to the object.

* * * * *